United States Patent
Toyoda et al.

(10) Patent No.: US 8,591,163 B2
(45) Date of Patent: Nov. 26, 2013

(54) FOUP OPENER AND OPERATING METHOD THEREOF

(75) Inventors: Noriyoshi Toyoda, Shinagawa-ku (JP); Hirofumi Nakamura, Shinagawa-ku (JP)

(73) Assignee: Hirata Corporation, Shinagawa-Ku, Tokyo (JP)

(*) Notice: Subject to any disclaimer, the term of this patent is extended or adjusted under 35 U.S.C. 154(b) by 265 days.

(21) Appl. No.: 13/020,912

(22) Filed: Feb. 4, 2011

(65) Prior Publication Data

US 2011/0188977 A1 Aug. 4, 2011

(30) Foreign Application Priority Data

Feb. 4, 2010 (JP) .................. 2010-023522

(51) Int. Cl.
*B65G 49/07* (2006.01)

(52) U.S. Cl.
USPC ......... 414/411; 414/217.1; 414/805; 414/940

(58) Field of Classification Search
USPC ....................... 414/217.1, 411, 805
See application file for complete search history.

(56) References Cited

U.S. PATENT DOCUMENTS

| | | | |
|---|---|---|---|
| 6,425,722 B1 * | 7/2002 | Ueda et al. ............. | 414/217 |
| 6,530,736 B2 * | 3/2003 | Rosenquist ............. | 414/411 |
| 6,663,148 B2 * | 12/2003 | Bonora et al. ............. | 292/159 |
| 6,984,097 B1 * | 1/2006 | Saeki et al. ............. | 414/411 |
| 7,074,000 B2 * | 7/2006 | Englhardt ............. | 414/217.1 |
| 8,215,891 B2 * | 7/2012 | Miyamoto ............. | 414/411 |
| 8,251,636 B2 * | 8/2012 | Sasaki et al. ............. | 414/810 |
| 2008/0092769 A1 | 4/2008 | Izumi et al. | |
| 2008/0112784 A1 * | 5/2008 | Rogers et al. ............. | 414/411 |
| 2009/0245981 A1 | 10/2009 | Miyajima et al. | |

FOREIGN PATENT DOCUMENTS

| | | | |
|---|---|---|---|
| JP | 2002164411 A | * | 6/2002 |
| JP | 2008-100635 A | | 5/2008 |
| JP | 2009-200200 A | | 9/2009 |
| JP | 2010-010396 A | | 1/2010 |

* cited by examiner

*Primary Examiner* — James Keenan

(74) *Attorney, Agent, or Firm* — Buchanan Ingersoll & Rooney PC

(57) ABSTRACT

To ensure that an abnormality in a closed state of a FOUP door serving as a lid of a FOUP can be detected quickly and reliably, a FOUP opener includes a port door attached detachably to an opening window in a port plate for separating the interior and exterior of a semiconductor processing device, and a dock unit for positioning the FOUP in a FOUP door attachment/detachment position. A suction disc mechanism and a lock mechanism for fixing the FOUP door to a FOUP main body and releasing the FOUP door are disposed on the port door. A FOUP door detection sensor for determining whether or not the FOUP door fixed to the FOUP main body, which is positioned in the FOUP door attachment/detachment position on the dock unit, is attached correctly to an opening portion of the FOUP main body is disposed on the port plate.

16 Claims, 8 Drawing Sheets

FOUP OPENER AND OPERATING METHOD THEREOF

BACKGROUND OF THE INVENTION

1. Field of the Invention

The present invention relates to a front opening unified pod (FOUP) opener used to open and close a lid (a FOUP door) of a semiconductor wafer transporting container (a FOUP) employed in a semiconductor manufacturing device or the like, and an operating method thereof.

2. Description of the Related Art

In a semiconductor manufacturing device, a transportation subject semiconductor wafer (to be referred to simply as a wafer hereafter) is typically transported automatically while housed in a transporting container known as a FOUP, a cassette, or similar. In this type of device, mechanisms and functions for preventing the semiconductor wafer from falling out of the container during transportation are under investigation.

For example, an overhead traveling vehicle such as the following has been proposed as a device for preventing a semiconductor wafer from falling (see Japanese Patent Application Publication No. 2008-100635).

The overhead traveling vehicle travels along a travel rail, and includes an elevation unit that raises and lowers a container serving as a transported article while holding the container, and a fall prevention member that prevents a lid of the held container from falling. The fall prevention member includes an upper portion frame and a lower portion frame, wherein the lower portion frame is disposed to be upwardly mobile relative to the upper portion frame. Further, a light emitting terminal or a light receiving terminal of a photoelectric sensor is provided on the lower portion frame. With this constitution, an abnormality in the lid is detected when the container is raised, and as a result, the lid is prevented from falling.

SUMMARY OF THE INVENTION

Incidentally, with the conventional overhead traveling device described above, an abnormality in the lid cannot be detected until transportation of the container serving as the transported article is begun.

However, to prevent the semiconductor wafer from falling with maximum reliability, it is preferable to determine whether or not the lid is correctly closed as early as possible.

The present invention has been designed in consideration of this problem, and an object thereof is to ensure that an abnormality in a closed state of a container lid can be detected quickly and reliably.

An invention of the present application is a FOUP opener including: a port plate for separating a wafer transfer space in a semiconductor processing device from an exterior space; a port door attached detachably to a wafer loading/unloading opening window formed in the port plate; a port door moving mechanism for moving the port door between a closed window position in which the opening window is closed and an open window position in which the opening window is open so that a semiconductor wafer can be loaded/unloaded; and a dock unit for positioning a FOUP used to transport the semiconductor wafer through the exterior space in a FOUP door attachment/detachment position in which an outer surface of a FOUP door attached detachably to an opening portion of a FOUP main body of the FOUP contacts an outer surface of the port door attached to the opening window of the port plate, the port door being provided with: a FOUP door holding member that can hold the FOUP door in contact with the port door; and a FOUP door fixing mechanism for fixing the FOUP door attached to the opening portion of the FOUP main body to the FOUP main body and for releasing the FOUP door from the FOUP main body, wherein a FOUP door detection sensor for detecting that the FOUP door fixed to the FOUP main body is attached to the opening portion of the FOUP main body while the FOUP main body is positioned in the FOUP door attachment/detachment position is disposed on the port plate.

The FOUP door detection sensor includes light emitting means and light receiving means, and the light emitting means and light receiving means are disposed in positions facing a space formed by the opening window in the port plate such that an optical path along which a light beam emitted by the light emitting means travels to the light receiving means passes through the space of the opening window.

The FOUP main body includes a recessed portion positioned to face an outer peripheral surface of the FOUP door when the FOUP door is attached to the opening portion of the FOUP main body, the FOUP door includes a FOUP door fixing member disposed to be capable of moving between a FOUP door fixing position in which the FOUP door fixing member engages with the recessed portion and a FOUP door releasing position in which engagement with the recessed portion is released, the FOUP door fixing mechanism activates the FOUP door fixing member to move to the FOUP door fixing position or the FOUP door releasing position, the FOUP door fixing member moves in an orthogonal direction to a FOUP door attachment/detachment direction and includes a projecting portion on a tip end thereof that engages with the recessed portion, and the light emitting means and light receiving means are disposed such that the optical path is formed within a range encompassing the space of the opening window in the port plate and a space that extends from a position of a port plate outer wall surface opposing the exterior space to a position located a predetermined distance toward the wafer transfer space side from the port plate outer wall surface.

The FOUP door detection sensor includes light emitting means and light receiving means, and the light emitting means and light receiving means are provided on an exterior space side surface of the port plate such that an optical path along which a light beam emitted by the light emitting means travels to the light receiving means passes between a port plate side end surface of the FOUP main body positioned in the FOUP door attachment/detachment position and an exterior space side surface of the port plate.

Indented portions are provided in a boundary portion between the exterior space side surface of the port plate and the opening window, a light emitting unit is formed by disposing the light emitting means in one of the indented portions, and a light receiving unit is formed by disposing the light receiving means in another of the indented portions.

The light emitting unit and the light receiving unit are disposed such that the optical path is parallel to the port plate side end surface of the FOUP main body positioned in the FOUP door attachment/detachment position.

Another invention of the present application is an operating method for a FOUP opener in which a port door is attached detachably to a wafer loading/unloading opening window formed in a port plate for separating a wafer transfer space in a semiconductor processing device from an exterior space, a dock unit carrying a FOUP used to transport a semiconductor wafer through the exterior space is provided, the dock unit positions the FOUP in a FOUP door attachment/detachment position in which an outer surface of a FOUP door attached detachably to an opening portion of a FOUP main body of the FOUP contacts an outer surface of the port door attached to the opening window of the port plate, and a FOUP door fixing member for attaching/detaching the FOUP door and a FOUP door holding member for holding the FOUP door when the FOUP door is removed are disposed on the port door, wherein a processed semiconductor wafer processed by the semiconductor processing device is loaded into the FOUP main body positioned in the FOUP door attachment/detachment position, the opening window is closed by the port door and the FOUP door is attached to the opening portion of the FOUP main body, the attached FOUP door is fixed to the FOUP main body, a hold exerted on the FOUP door by the port door is released, and the FOUP is then unloaded from the dock unit, the method including, between release of the hold on the FOUP door and unloading of the FOUP: a port door withdrawal step of causing the port door closing the opening window in the port plate to retreat in a direction heading away from the FOUP door so that the port door moves to a withdrawn position located a predetermined distance away from a FOUP door hold releasing position; a FOUP door detecting step of determining with a sensor whether or not the FOUP door of the FOUP positioned in the FOUP door attachment/detachment position is projecting outwardly from a port door side end surface of the FOUP main body; and a port door returning step of re-closing the opening window using the port door by moving the withdrawn port door back to a position of contact with the FOUP door.

The FOUP door detecting step is a step of determining whether or not the FOUP door fixed to the FOUP main body positioned in the FOUP door attachment/detachment position is projecting to the wafer transfer space side from a plane that is flush with the port plate outer surface on the basis of whether or not a light beam emitted by light emitting means of the sensor can be received by light receiving means.

The port door withdrawal step is a step of releasing a hold exerted by the port door on the FOUP door by activating the FOUP door holding member in a state where the FOUP door is fixed to the opening portion of the FOUP main body positioned in the FOUP door attachment/detachment position, and then causing the port door to retreat to a position in which an optical path of the light beam emitted by the light emitting means is not blocked.

According to the invention of the present application, jutting out and tilting of the FOUP door attached to the FOUP main body while the FOUP main body is positioned in the FOUP door attachment/detachment position is detected by the FOUP door detection sensor, and it is therefore possible to determine whether or not the FOUP door is fixed correctly to the FOUP main body. In other words, it is possible to determine quickly and reliably whether or not the FOUP door is fixed to the FOUP main body in a correct condition and a correct attitude before starting an operation to unload the FOUP main body from the FOUP door attachment/detachment position.

Further, the light emitting means and light receiving means of the FOUP door detection sensor are disposed such that the optical path of the light beam from the light emitting means reaches the light receiving means by traveling only through a window space surrounded by an inner peripheral surface of the opening window. Therefore, the light beam is not blocked by another member, and as a result, the aforesaid determination can be performed reliably.

Furthermore, the light emitting means and light receiving means are disposed such that the optical path is formed within a range encompassing the space of the opening window in the port plate and a space that extends from the position of the port plate outer wall surface opposing the exterior space to the position located a predetermined distance toward the wafer transfer space side from the port plate outer wall surface, and therefore, when the FOUP door is fixed correctly to the FOUP main body in a predetermined fixing position, the light beam emitted by the light emitting means can be received reliably by the light receiving means. Moreover, when the FOUP door is not in the correct fixing position, the light beam emitted by the light emitting means is reliably blocked by the FOUP door, and therefore the determination as to whether or not the FOUP door is fixed correctly in the predetermined fixing position can be made more reliably.

The determination as to whether or not the FOUP door is fixed correctly in the predetermined fixing position can also be made reliably by providing the light emitting means and light receiving means on the exterior space side surface of the port plate such that the optical path along which the light beam emitted by the light emitting means of the FOUP door detection sensor travels to the light receiving means passes between the port plate side end surface of the FOUP main body positioned in the FOUP door attachment/detachment position and the exterior space side surface of the port plate.

Moreover, by providing the indented portions in the boundary portion between the exterior space side surface of the port plate and the opening window, forming the light emitting unit by disposing the light emitting means in one of the indented portions, and forming the light receiving unit by disposing the light receiving means in the other indented portion, opening and closing of the FOUP door are not obstructed.

Further, by disposing the light emitting means and the light receiving means of the FOUP door detection sensor such that the optical path of the light beam emitted by the light emitting means is parallel to the port plate side end surface of the FOUP main body positioned in the FOUP door attachment/detachment position, the sensor can determine whether or not the FOUP door is projecting to the outside of the FOUP main body from the port plate side end surface of the FOUP main body more easily and more reliably in a case where the FOUP door is not fixed to the FOUP main body correctly in the predetermined fixing position.

According to the other invention of the present application, the port door withdrawal step of causing the port door closing the opening window in the port plate to retreat in a direction heading away from the FOUP door so that the port door moves to a withdrawn position located a predetermined distance away from a FOUP door hold releasing position, the FOUP door detecting step of determining with the sensor whether or not the FOUP door of the FOUP positioned in the FOUP door attachment/detachment position is projecting outwardly from the port door side end surface of the FOUP main body, and the port door returning step of re-closing the opening window using the port door by moving the withdrawn port door back to a position of contact with the FOUP door are provided between release of the hold on the FOUP door and unloading of the FOUP, and therefore the determination as to whether or not the FOUP door is fixed to the FOUP main body correctly in the predetermined fixing position can be made quickly and accurately.

Further, the FOUP door detecting step is a step of determining whether or not the FOUP door fixed to the FOUP main body positioned in the FOUP door attachment/detachment position is projecting to the wafer transfer space side from a plane that is flush with the port plate outer surface on the basis of whether or not the light beam emitted by the light emitting means of the sensor can be received by the light receiving means, and therefore the determination described above can be made even more accurately.

Furthermore, the port door withdrawal step is a step of releasing the hold exerted by the port door on the FOUP door by activating the FOUP door holding member in a state where the FOUP door is fixed to the opening portion of the FOUP main body positioned in the FOUP door attachment/detachment position, and then causing the port door to retreat to a position in which an optical path of the light beam emitted by the light emitting means is not blocked, and therefore the determination as to whether or not the fixing position of the FOUP door is correct can be made with the FOUP in the FOUP door attachment/detachment position. Hence, the fixed state of the FOUP door can be detected before starting to move the FOUP, and therefore problems such as falling of the FOUP door, jutting out of the wafer, and so on can be prevented reliably.

BRIEF DESCRIPTION OF THE DRAWINGS

FIG. 4 is an illustrative view illustrating an operation of the FOUP opener in FIG. 1, wherein FIG. 4A shows a state in which the FOUP is positioned in an undocking position, FIG. 4B shows a state in which the FOUP is positioned in a FOUP door attachment/detachment position, FIG. 4C shows a state in which the port door holding the FOUP door has retreated to a withdrawn position, and FIG. 4D shows a state in which the port door holding the FOUP door is positioned in a lowered position;

DESCRIPTION OF THE PREFERRED EMBODIMENTS

An embodiment of a FOUP opener according to the present invention will be described in detail below with reference to the drawings.

A FOUP opener M (see FIG. 1) is a device for opening and closing a FOUP door 30 relative to a FOUP main body 20 of a FOUP 10 used to transport a wafer W in a device that handles wafers, such as a semiconductor manufacturing device. The FOUP opener M is capable of loading and unloading the wafer W into and out of the FOUP.

Figure 1:
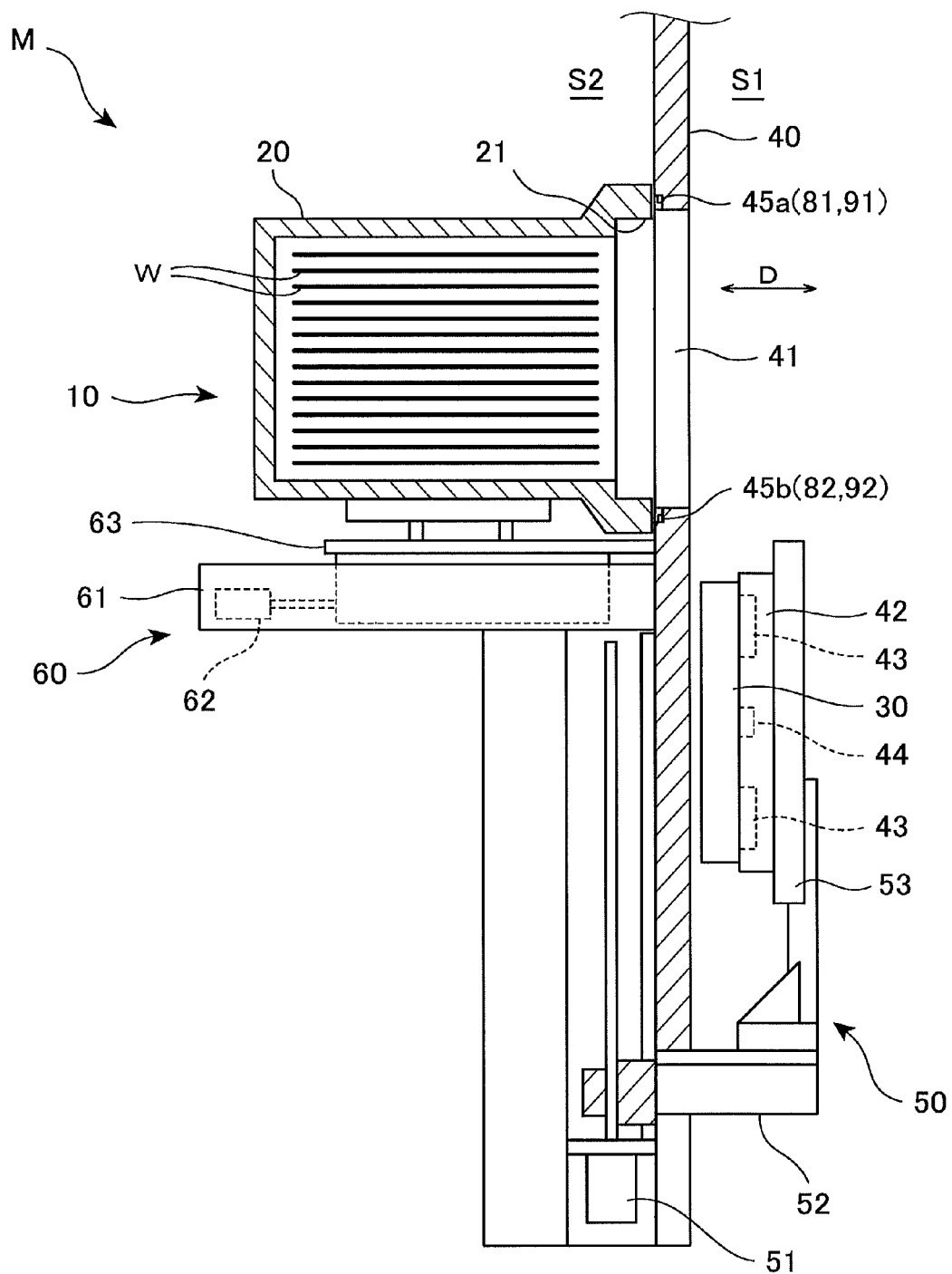
FIG. 1 is a side sectional view showing a FOUP opener according to an embodiment of the present invention in a state where a port door is positioned in an open position.
Figure 3:
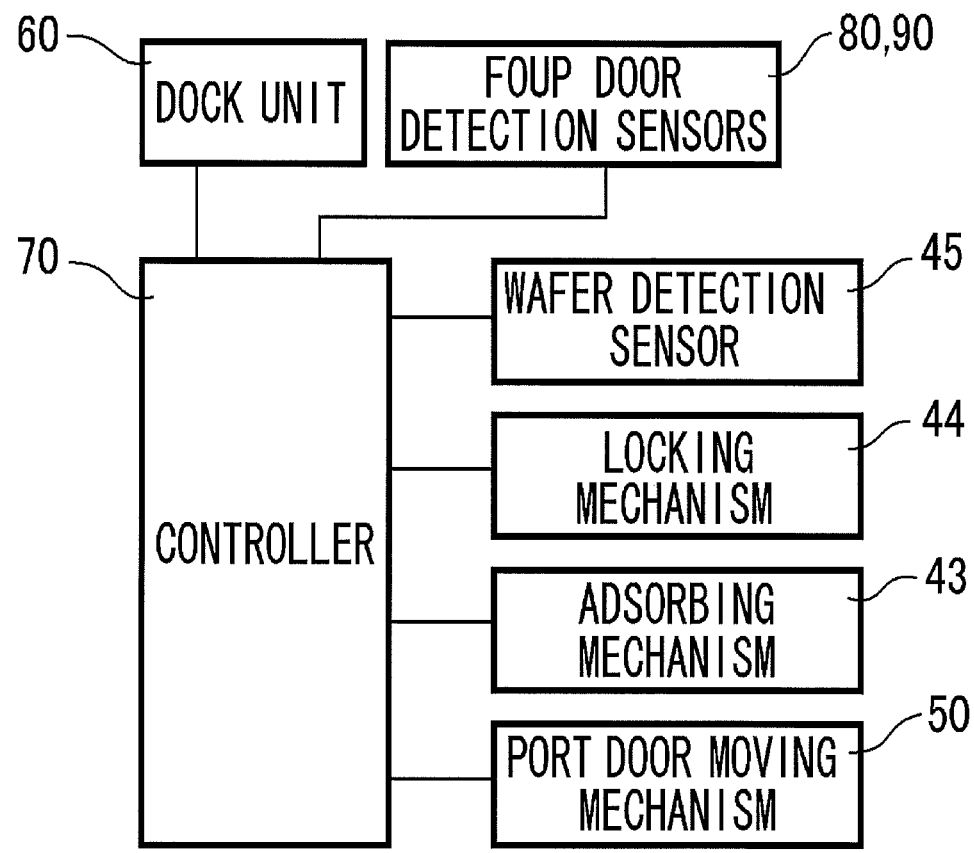
FIG. 3 is a block diagram showing a controller of the FOUP opener in FIG. 1.

As shown in FIG. 1, the FOUP opener M includes a port plate 40 that separates a wafer transfer space (a space to the right of the port plate 40 in FIG. 1) S1 within the semiconductor manufacturing device (substrate processing device) from an exterior space (a space to the left of the port plate 40 in FIG. 1) S2, a port door moving mechanism 50 disposed adjacent to the port plate 40 in the wafer transfer space S1, a dock unit 60 disposed adjacent to the port plate 40 in the exterior space S2, and a controller 70 (see FIG. 3) for controlling operations of these components.

The FOUP 10 is a container used to transport wafers in the exterior space S2, and is constituted by the FOUP main body 20, in which a plurality of the wafers W are housed horizontally, and the FOUP door 30, which serves as a lid body that is attached detachably to an opening portion 21 formed on one side of the FOUP main body 20.

Figure 7:
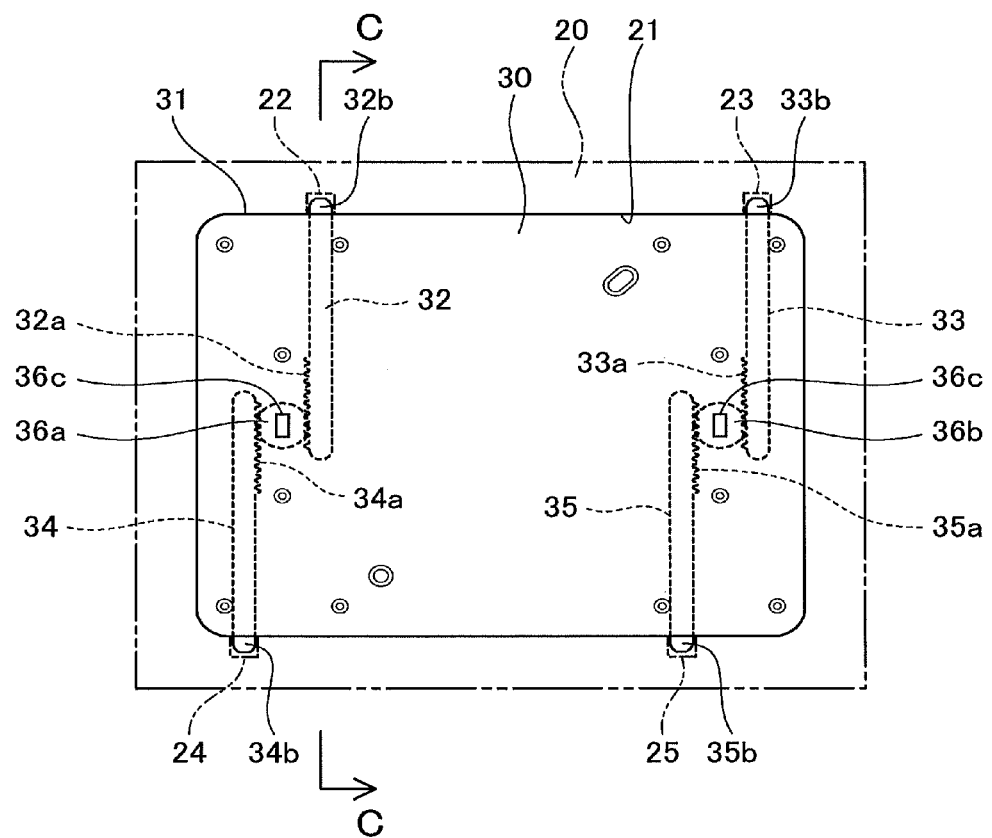
FIG. 7 is a front view showing the FOUP door of a FOUP that is loaded/unloaded into/from a dock unit of the FOUP opener shown in FIG. 1.

As shown in FIG. 7, in the FOUP main body 20, recessed portions 22 to 25 used to fix the attached FOUP door 30 are provided in an inner peripheral surface of the opening portion 21. More specifically, the recessed portions 22 to 25 are formed in the inner peripheral surface of the opening portion 21 in two locations of an upper surface portion and two locations of a lower surface portion. Note that the inner peripheral surface is a FOUP main body inside surface that opposes an outer peripheral surface 31 of the FOUP door 30 when the FOUP door 30 is attached to the FOUP main body 20.

The FOUP door 30 includes latch bars 32 to 35 (FOUP door fixing members) that can be latched to the recessed portions 22 to 25 of the FOUP main body 20 detachably. The four latch bars 32 to 35 are provided to correspond to the respective recessed portions 22 to 25. Each latch bar 32 to 35 extends in a vertical direction and is disposed to be capable of moving vertically between a FOUP door fixing position in which the latch bar engages with the corresponding recessed portion 22 to 25, and a FOUP door releasing position in which the engagement with the recessed portion 22 to 25 is released. Note that the latch bars 32 to 35 move in the vertical direction, i.e. an orthogonal direction to a FOUP door attachment/detachment direction D (see FIG. 1) and a parallel direction to an extension direction of the port plate 40 (a port plate outer surface 40a; see FIG. 4A).

Each latch bar 32 to 35 is provided with a rack portion 32a to 35a on a side face serving as a base portion positioned toward the FOUP door center. The rack portions 32a to 35a are disposed to mesh with gears 36a, 36b disposed on the FOUP door 30. Hence, when the gears 36a, 36b rotate, the latch bars 32 to 35 move vertically so as to appear from a peripheral edge of the FOUP door 30, and thus the latch bars 32 to 35 are capable of moving between the positions described above. In other words, a mechanism constituted by the rack portions 32a to 35a and the gears 36a, 36b serves as a FOUP door fixing mechanism for operating the latch bars 32 to 35.

Further, a projecting portion 32b to 35b that engages with the corresponding recessed portion 22 to 25 of the FOUP main body is provided on a tip end of each latch bar 32 to 35. The projecting portions 32b to 35b may be chamfered.

As shown in FIG. 2A, the port plate 40 includes a substantially square penetrating opening window 41. When the opening window 41 is open, the wafer transfer space S1 communicates with the external space S2. A port door 42 that is substantially square in planar view can be attached detachably to the opening window 41. When the port door 42 is attached to the opening window 41, the opening window 41 is closed, and therefore the wafer transfer space S1 is separated from the external space S2.

Note that wafer detection sensors 45*a*, 45*b* (see FIG. 2) and FOUP door detection sensors 80, 90 (see FIG. 2) disposed in positions on the opening window 41 of the port plate 40 will be described below.

The port door 42 is supported by a port door moving mechanism 50. The port door 42 can thereby be raised and lowered between an open window position (=a lowered position; see FIG. 4D) in which the opening window 41 is open, and an intermediate position (=a raised position or a withdrawn position; see FIG. 4C) raised from the open window position. Further, the port door 42 can thereby advance and retreat between the intermediate position and a closed window position (=an advanced position; see FIG. 4B) in which the opening window is closed. In other words, the port door 42 is capable of moving between the open window position and the closed window position. Note that when the port door 42 is positioned in the closed window position in the device according to this embodiment, a port door outer surface 42*a* (see FIG. 4A) positioned on the outside space S2 side of the port door 42 is positioned to project slightly further (by approximately 1 mm) toward the outside space S2 than the port plate outer surface 40*a*.

When the port door 42 is in the open window position, the entire port door 42 is positioned below the opening window 41, and therefore an interior space of the FOUP 10 (the FOUP main body 20) positioned on the exterior space side faces the wafer transfer space S1, making loading and unloading of the wafer W possible. When the port door 42 is in the closed window position, on the other hand, the opening window 41 is closed, and therefore the interior space of the FOUP 10 is cut off from the wafer transfer space S1.

An adsorbing mechanism 43 (FOUP door holding member) for holding the FOUP door 30 through adsorption, and a locking mechanism 44 (latchkey, FOUP door fixing mechanism) for fixing the FOUP door 30 adsorbed to the FOUP main body 20 to the FOUP main body 20 or releasing the FOUP door 30 are disposed on the port door 42.

The adsorbing mechanism 43 includes an adsorption member (a suction disc), not shown in the drawings, and suction means connected to the adsorption member. When the FOUP door 30 is in contact with the port door 42, an adsorption surface of the adsorption member is positioned to contact the FOUP door 30. By activating the suction means when this state of contact is established, the FOUP door 30 is adsorbed to and held by the suction member.

The locking mechanism 44 includes a latchkey (not shown) that engages with an engagement hole 36*c* formed in each of the gears 36*a*, 36*b* of the FOUP door 30 when the FOUP door 30 is in contact with the port door 42. When the FOUP door 30 is in contact with the port door 42, the latchkeys are inserted into and engaged to the engagement holes 36*c*. When the latchkeys are rotated while engaged to the engagement holes 36*c* in the gears, the gears 36*a*, 36*b* rotate, and as a result, the latch bars 32 to 35 move vertically to the FOUP door fixing position or the FOUP door releasing position.

The port door moving mechanism 50 includes a port door elevating mechanism portion 51, a port door advancing/withdrawing mechanism portion 52 disposed on the port door elevating mechanism portion 51, and a port door holding portion 53 disposed on the port door advancing/withdrawing mechanism portion 52.

Figure 4:
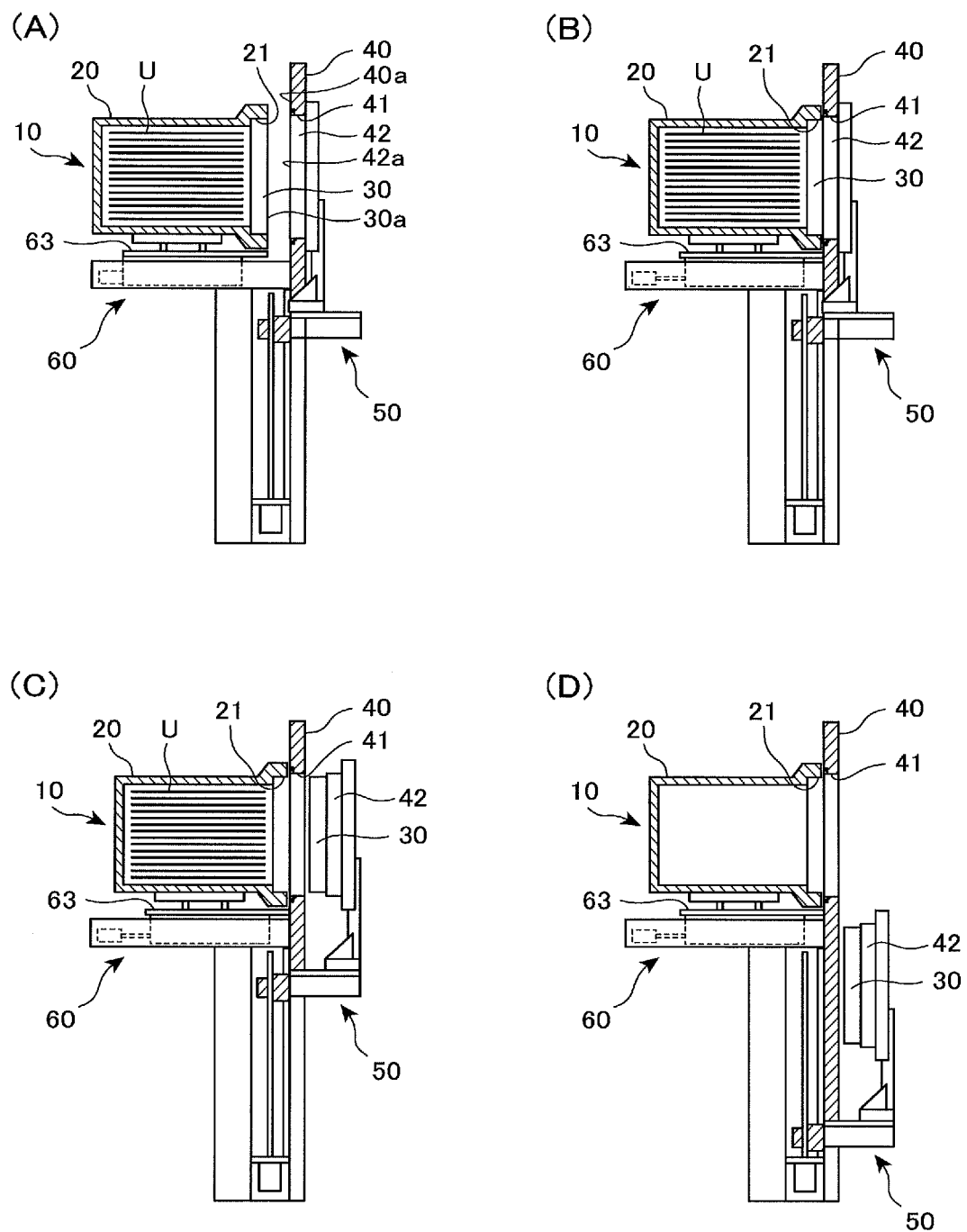

The port door elevating mechanism portion 51 is capable of raising and lowering the port door advancing mechanism portion 52 between the lowered position shown in FIGS. 1 and 4D and the raised position shown in FIG. 4C. The port door advancing/withdrawing mechanism portion 52 is capable of causing the port door 42 held by the port door holding portion 53 to advance and retreat between the withdrawn position shown in FIG. 4C and an advanced position (=the closed window position) shown in FIG. 4B. As a result, the port door 42 can perform the movements described above.

The dock unit 60 is a carrying destination of the FOUP 10 serving as a wafer transportation container. The dock unit 60 includes a dock main body 61 fixed to the port plate 40, a cylinder (a dock plate moving mechanism) 62 disposed in the dock main body 61, and a dock plate 63 that is moved by the cylinder 62.

The dock plate 63 holds the FOUP 10 carried thereon such that the FOUP 10 is positioned relative to the dock plate 63. The dock plate 63 can be moved toward and away from the port plate 40 by the cylinder 62 coupled thereto. By causing the dock plate 63 to advance to the port plate 40 side while carrying the FOUP 10, the FOUP 10 is positioned in a FOUP door attachment/detachment position (see FIGS. 1 and 4B). The FOUP door attachment/detachment position is a position in which the wafer W is loaded into and unloaded from the FOUP 10. More specifically, in the FOUP door attachment/detachment position, the FOUP door 30, which is fixed to the advanced FOUP 10, contacts the port door 42 in the closed window position. When the dock plate 63 is moved away from the port plate 40 to a withdrawal limit position, on the other hand, the dock plate 63 is positioned in a FOUP loading/unloading position in which the FOUP 10 is loaded onto (or unloaded from; see FIG. 4A) the dock unit 60. The FOUP 10 is carried onto the dock plate 63 in the FOUP loading/unloading position and unloaded from the dock plate 63 in the FOUP loading/unloading position by a transportation device or the like, not shown in the drawings. Note that the cylinder 62 used to move the dock plate 63 to the respective positions described above is a universally known mechanism, and therefore detailed description thereof has been omitted.

Figure 2:
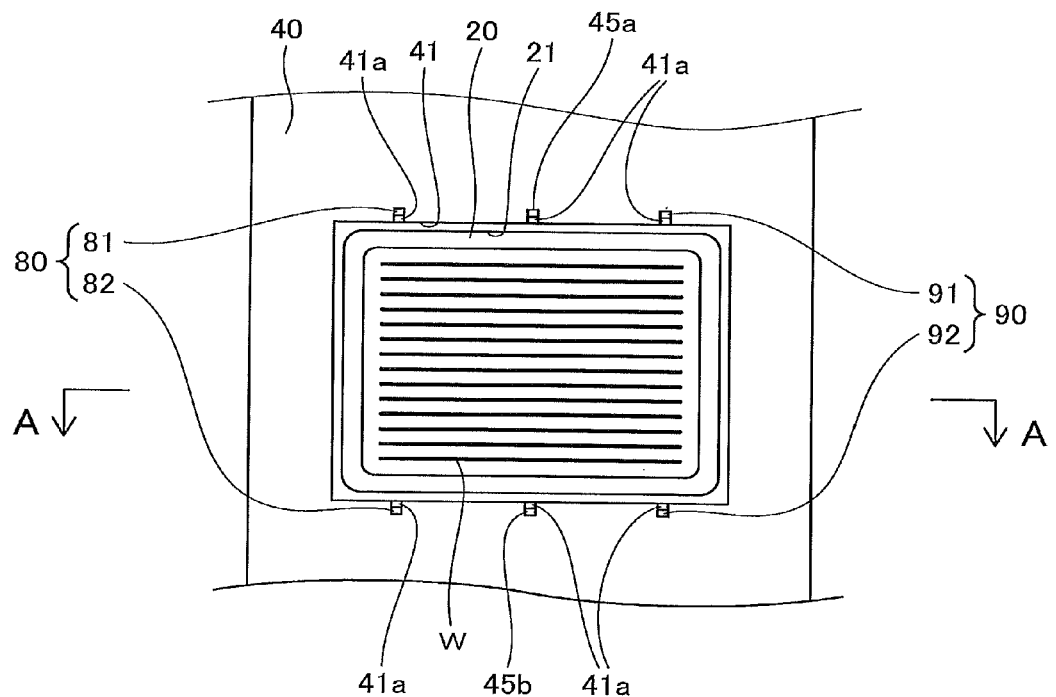
FIG. 2A is a front view showing the periphery of an opening window in the port door of the FOUP opener in FIG. 1.
FIG. 2B is a sectional view taken along an arrow line A-A in FIG. 2A.
Figure 2:
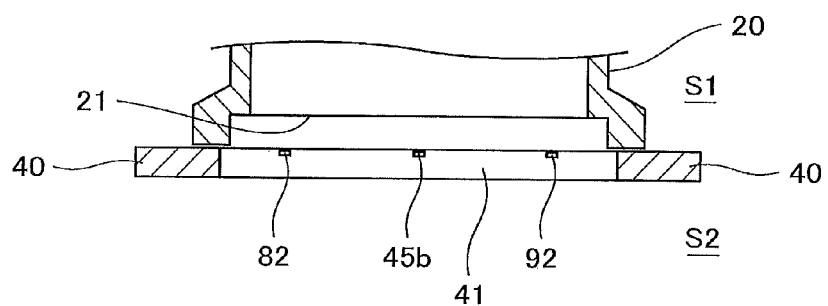

As shown in FIG. 2, the wafer detection sensor 45 and the FOUP door detection sensor 80 are disposed on the opening window 41 of the port plate 40.

The wafer detection sensor 45 detects a wafer W that juts out from the opening portion 21 while housed in the FOUP main body 20. The wafer detection sensor 45 includes a wafer detection light emitting unit 45*a* having a wafer detection light emitting body and a wafer detection light receiving unit 45*b* having a wafer detection light receiving body, which are disposed in or close to a boundary portion between an upper surface (or a lower surface) of an inner peripheral surface of the opening window 41 and the port plate outer surface 40*a* opposing the exterior space S2. The wafer detection light emitting unit 45*a* and the wafer detection light receiving unit 45*b* are disposed opposite each other, and a detection light beam emitted by the light emitting body of the wafer detection light emitting unit 45*a* advances in vertically downward so as to be received by the light receiving body of the light receiving unit 45*b*. An optical path of the detection light beam traveling from the wafer detection light emitting unit 45*a* to the wafer detection light receiving unit 45*b* may be set in any of a vertical direction, a horizontal direction, and a diagonal direction.

More precisely, the wafer detection light emitting unit 45*a* is disposed in a boundary portion between a central position on the upper surface of an inner peripheral portion of the opening window 41 and the exterior space side surface of the port plate 40. When the wafer W housed in the FOUP main body 20 in the FOUP door attachment/detachment position juts out through the opening portion, the optical path of the light beam emitted by the wafer detection light emitting unit 45*a* in this position passes a position in which an amount by which the wafer W juts out is greatest. By disposing the wafer detection light emitting unit 45a and wafer detection light receiving unit 45b in the above positions, jutting out of the wafer W can be detected more accurately and more quickly.

The FOUP door detection sensors 80, 90 determine whether or not the FOUP door 30 fixed to the opening portion 21 of the FOUP main body 20 positioned in the FOUP door attachment/detachment position is fixed to the FOUP main body 20 correctly in a predetermined fixing position. In this embodiment, two FOUP door detection sensors 80, 90 are provided.

Figure 8:
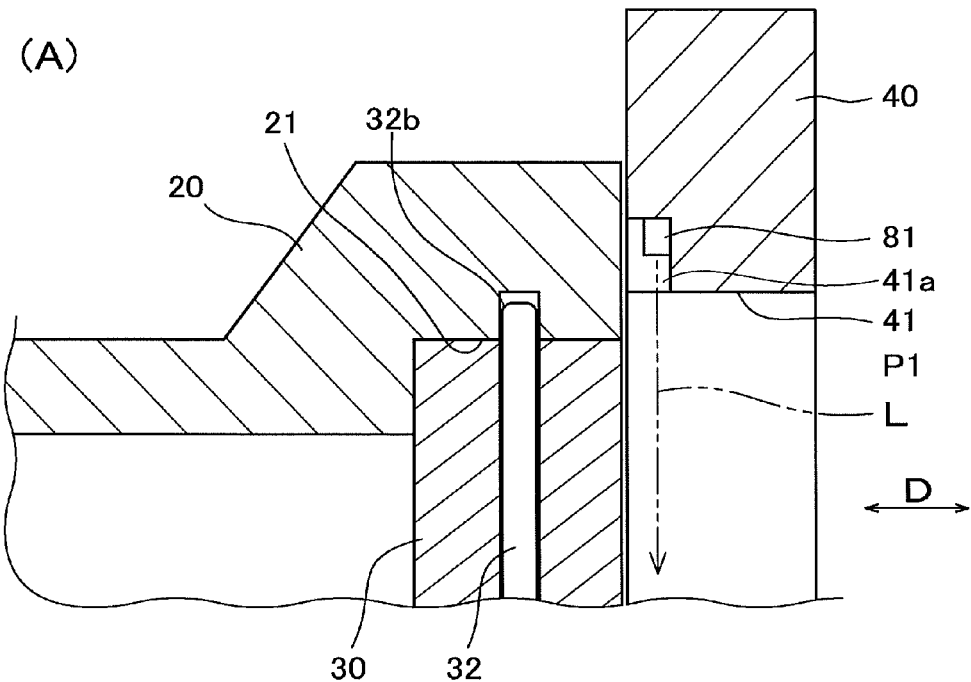
FIG. 8A is a sectional view taken along a C-C line in FIG. 7 and showing a FOUP door fixing member formed on the FOUP main body and the FOUP.
FIG. 8B is a sectional view taken along the C-C line in FIG. 7 and showing an example of a state in which the FOUP door is attached to the FOUP main body incorrectly.
Figure 8:
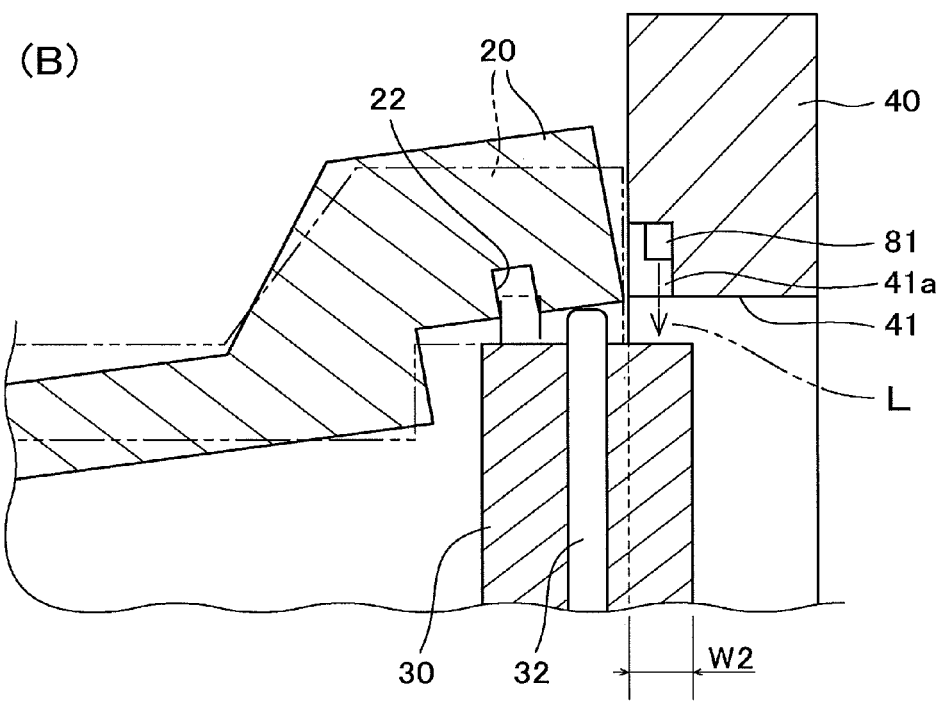

A first FOUP door detection sensor 80 includes a first FOUP door detection light emitting unit 81 (light emitting means) having a first FOUP door detection light emitting body and a first FOUP door detection light receiving unit 82 (light receiving means) having a first FOUP door detection light receiving body, which are disposed in or close to a boundary portion between the upper surface (or the lower surface) of the inner peripheral surface of the opening window 41 and the port plate outer surface 40a opposing the exterior space S2. The first FOUP door detection light emitting unit 81 and the first FOUP door detection light receiving unit 82 are disposed opposite each other. A detection light beam emitted by the light emitting body of the first FOUP door detection light emitting unit 81 advances vertically downward so as to be received by the light receiving body of the first FOUP door detection light receiving unit 82. An optical path L (see FIG. 8) of the light beam is set in an orthogonal direction to the FOUP door attachment/detachment direction D (see FIG. 1) and a parallel direction to the port plate outer surface 40a. In other words, providing no obstructions are encountered midway, the light beam emitted by the first FOUP door detection light emitting body 81 passes through a space (a window space) formed by the opening window in the port plate 40 and is thus received by the first FOUP door detection light receiving unit 82. The first FOUP door detection sensor 80 disposed in this manner is capable of determining whether or not at least a part of the FOUP door 30 fixed to the FOUP main body 20 positioned in the FOUP door attachment/detachment position is projecting to the wafer transfer space side from a plane that is flush with the port plate outer surface 40a. More precisely, the space formed by the opening window (the window space hereafter) is a space surrounded by a plane that is flush with an inner wall surface of the port plate 40 opposing the wafer transfer space S1, a plane that is flush with the port plate outer surface 40a opposing the exterior space S2, and the inner peripheral surface of the opening window 41.

As shown in FIG. 2A, the first FOUP door detection light emitting unit 81 is provided on the upper surface of the inner peripheral portion of the opening window 41 in a position to the left of the aforementioned wafer detection light emitting unit 45a. A light emitting element such as a light emitting diode or a laser diode, for example, may be used as the first FOUP door detection light emitting unit 81.

Further, the disposal position of the first FOUP door detection sensor 80 is not limited to a position in or close to the boundary portion between the upper surface (or the lower surface) of the inner peripheral surface of the opening window 41 and the port plate outer surface 40a opposing the exterior space S2. In this embodiment, the first FOUP door detection light emitting unit 81 (and the light receiving unit 82) of the first FOUP door detection sensor 80 is disposed such that the optical path L thereof is formed within a range that encompasses the space of the opening window 41 in the port plate 40 and a space that extends from the position of the port plate outer wall surface opposing the exterior space S2 to a position located a predetermined distance toward the wafer transfer space S1 side from the port plate outer wall surface. Here, various distances may be employed as the predetermined distance, for example a distance corresponding to a door displacement amount (FOUP door displacement amount) generated when the FOUP door is not engaged by the latch bars 32 to 35, or in other words a minimum distance (a minimum projection amount hereafter) of a projection distance W2 (see FIG. 8B) by which the FOUP door 30 projects in the FOUP movement direction from an opening end surface of the FOUP main body 20 when the projecting portions 32b to 35b do not engage with the recessed portions 22 to 25 during a FOUP door fixing operation. The minimum projection amount of the FOUP door corresponds to an average distance of approximately 3 to 5 mm in the case of a FOUP door for a FOUP used with a 300 mm wafer, for example. With regard to FOUPs of other sizes, the minimum projection amount should be set appropriately.

Note that the disposal position of the first FOUP door detection sensor 80 is not limited to the inner peripheral portion of the opening window 41, and the first FOUP door detection sensor 80 may be provided on the exterior space S2 side surface of the port plate 40 so that the optical path L along which the light beam emitted by the light emitting unit travels to the light receiving unit passes between the port plate side end surface of the FOUP main body 20 positioned in the FOUP door attachment/detachment position and the exterior space side surface of the port plate 40.

Further, in a case where the FOUP door 30 is not fixed to the FOUP main body 20 in the predetermined correct fixing position, the optical path L of the light beam emitted from the first FOUP door detection light emitting, unit 81 passes a position in which the FOUP door 30 clearly juts out from the FOUP main body open end. In other words, when the FOUP door 30 is not fixed to the FOUP main body 20 in the correct fixing position while the FOUP main body 20 is positioned in the FOUP door attachment/detachment position, the first FOUP door detection light emitting unit 81 of the first FOUP door detection sensor 80 is disposed in a position where the optical path L is blocked by the FOUP door 30. Hence, by employing the first FOUP door detection sensor 80 constituted by the first FOUP door detection light emitting unit 81 and the first FOUP door detection light receiving unit 82, which are positioned in the positions described above, tilting and jutting out of the FOUP door 30 when the FOUP door 30 is fixed incorrectly can be detected more quickly and more reliably.

Furthermore, the optical path L of the light beam emitted from the first FOUP door detection light emitting unit 81 is parallel to the port plate side end surface of the FOUP main body 20 positioned in the FOUP door attachment/detachment position. Hence, when the FOUP door 30 is fixed incorrectly, a position in which the FOUP door 30 juts out from the opening portion end surface of the FOUP main body 20 by a large amount can be set reliably as a detection subject position of the FOUP door detection sensor 80, and as a result, a situation in which the FOUP door 30 is fixed incorrectly can be detected quickly and reliably.

By providing the first FOUP door detection sensor 80, an incorrect FOUP door fixing condition in which the FOUP door 30 is fixed in an incorrect position (a position on a front side (the port plate 40 side) of the upper side recessed portion 22) shown in FIG. 8B rather than the correct predetermined fixing position (within the upper side recessed portion 22 and the lower side recessed portion 24) shown in FIG. 8A can be detected quickly and reliably.

Note that the correct fixing position of the FOUP door 30 is set such that when the FOUP door 30 is attached and fixed to the FOUP main body 20, the projecting portions 32*d* to 35*d* on the respective tip ends of the latch bars 32 to 35 engage with the recessed portions 22 to 25 of the FOUP main body 20, and any other fixing positions of the FOUP door 30 are so-called incorrect fixing positions rather than the correct fixing position. When the FOUP door 30 is fixed in the correct fixing position, no part of the FOUP door 30 juts out from the end surface of the opening portion 21 in the FOUP main body 20, but when the FOUP door 30 is fixed in an incorrect fixing position, a part thereof juts out from the end surface of the opening portion 21 in the FOUP main body 20.

The second FOUP door detection sensor 90 is disposed in a left-right symmetrical position relative to the first FOUP door detection sensor, and detailed description thereof has been omitted. In short, as shown in FIG. 2A, the second FOUP door detection light emitting unit 91 according to this embodiment is provided in a position to the right of the aforementioned wafer detection light emitting unit 45*a* on the upper surface of the inner peripheral portion of the opening window 41, while the second FOUP door detection light receiving unit 92 is disposed in a position vertically downward of the second FOUP door detection light emitting unit 91.

Note that in this embodiment, an example employing two FOUP door detection sensors, namely the first FOUP door detection sensor 80 and the second FOUP door detection sensor 90, has been described, but only one of the first and second FOUP door detection sensors 80, 90 may be used, or three or more FOUP door detection sensors may be used. Alternatively, the wafer detection sensor 45 may be used as a FOUP door detection sensor.

The light emitting units and light receiving units of the respective sensors are provided not to project into the window space surrounded by the inner surface of the opening window 41. For example, the light emitting units and light receiving units are disposed in indented portions 41*a* provided by forming notches or the like in the port plate 40. Hence, when the port door 42 and the FOUP door 30 are moved, movement paths of the doors do not interfere with the light emitting units 81, 91 and light receiving units 82, 92, and as a result, the doors 30, 42 can be moved smoothly to the wafer transfer space S1 side of the opening window 41. Further, the light emitting units and light receiving units need not be provided directly in the indented portions 41*a*, and instead, light emitting elements and light receiving elements may be disposed in positions removed from the indented portions 41*a*, whereupon the light emitting elements and light receiving elements are connected to the respective indented portions 41*a* by optical fiber or the like.

The controller 70 (see FIG. 3) is a universally known computer including a CPU, a RAM, a ROM, a memory for storing data and the like, and an input/output interface such as a mouse or a key input unit, which is operated by a predetermined OS.

As will be understood from the following description of an operation, the controller 70 functions as a dock plate moving mechanism control unit, a FOUP door detection control unit, a wafer detection control unit, a FOUP door fixing mechanism control unit, a FOUP door holding mechanism control unit, and a port door moving mechanism control unit.

Next, an operation of the FOUP opener M according to this embodiment will be described with reference to the drawings.

First, the FOUP housing the wafers W is loaded onto the dock unit 60 by transporting means, not shown in the drawings (FOUP loading step).

At this time, the FOUP 10 is carried on the dock plate 63, which is positioned in the FOUP loading/unloading position of the dock unit 60 (see FIG. 4A).

Next, the dock plate 63 is caused to advance by the cylinder 62 such that the FOUP main body 20 is positioned in the FOUP door attachment/detachment position (FOUP positioning step).

When the FOUP 10 on the dock plate 63 is positioned in the FOUP door attachment/detachment position, the outer surface 30*a* of the FOUP door 30 of the FOUP 10 carried on the dock plate 63 contacts the outer surface 42*a* of the port door 42 in the closed window position (see FIG. 4B). In this state, the latchkeys of the lock mechanism 44 provided on the port door 42 are engaged with the engagement holes 36*c* in the gears 36*a*, 36*b* of the FOUP door. As described above, the outer surface 42*a*\* of the port door 42\* in the closed window position projects into the exterior space S2 through the outer surface 40*a* of the port plate 40, and therefore, to be exact, the opening portion end surface of the FOUP 10 in the FOUP door attachment/detachment position does not contact the port plate outer surface 40*a*, and instead, a slight gap exists between the port plate 40 and the FOUP 10.

Next, the adsorption mechanism 43 of the port door 42 is activated such that the FOUP door 30 is adsorbed by the adsorption mechanism 43 (FOUP door holding step).

As a result, the FOUP door 30 is held on the port door 42.

Next, the latchkeys of the lock mechanism 44 are rotated to move the latch bars 32 to 35 to the FOUP door releasing position (FOUP door releasing step).

As a result, it becomes possible to remove the FOUP door 30 from the FOUP main body 20.

Next, the port door moving mechanism 50 is activated to cause the port door 42 to retreat toward the withdrawn position (door removing step).

As a result, the FOUP door 30 held on the port door 42 is removed from the FOUP main body 20, whereby the opening portion 21 of the FOUP main body 20 is opened. Finally, the port door 42 and FOUP door 30 are moved by the port door moving mechanism 50 to the lowered position shown in FIG. 4D, where they remain on standby. When this state is established, the wafers W housed in the FOUP main body 20 can be unloaded through the opening portion 21 in the FOUP main body 20.

The wafers W in the FOUP main body 20 are then unloaded into the wafer transfer space by a wafer transfer device, not shown in the drawings (wafer unloading step; see FIG. 4D).

The wafers W are processed by a processing device, not shown in the drawings, and then reloaded into the FOUP main body 20 by the wafer transfer device (wafer loading step).

Next, the port door moving mechanism 50 is activated such that the FOUP door 30 held by the port door 42 is attached to the FOUP main body 20 (FOUP door attaching step; see FIG. 4B).

As a result, the FOUP door 30 is attached to the opening portion 21 of the FOUP main body 20.

Next, the latchkeys of the lock mechanism 44 are rotated to move the latch bars 32 to 35 to the FOUP door fixing position (FOUP door fixing step).

At this time, the FOUP door 30 is fixed to the FOUP main body 20 in the correct fixing position when the tip ends of the latch bars 32 to 35 are engaged respectively with the recessed portions 22 to 25 of the FOUP main body. If the tip end of any one of the latch bars 32 to 35 does not engage with the corresponding recessed portion 22 to 25 of the FOUP main body, on the other hand, the FOUP door 30 is not fixed to the FOUP main body 20 in the correct fixing position.

Next, the adsorption mechanism (FOUP door holding member) 43 of the port door 42 is activated to halt the adsorption operation, whereby adsorption of the FOUP door 30 is released (FOUP door hold releasing step).

As a result, the hold exerted on the FOUP door 30 by the port door 42 is released.

Figure 5:
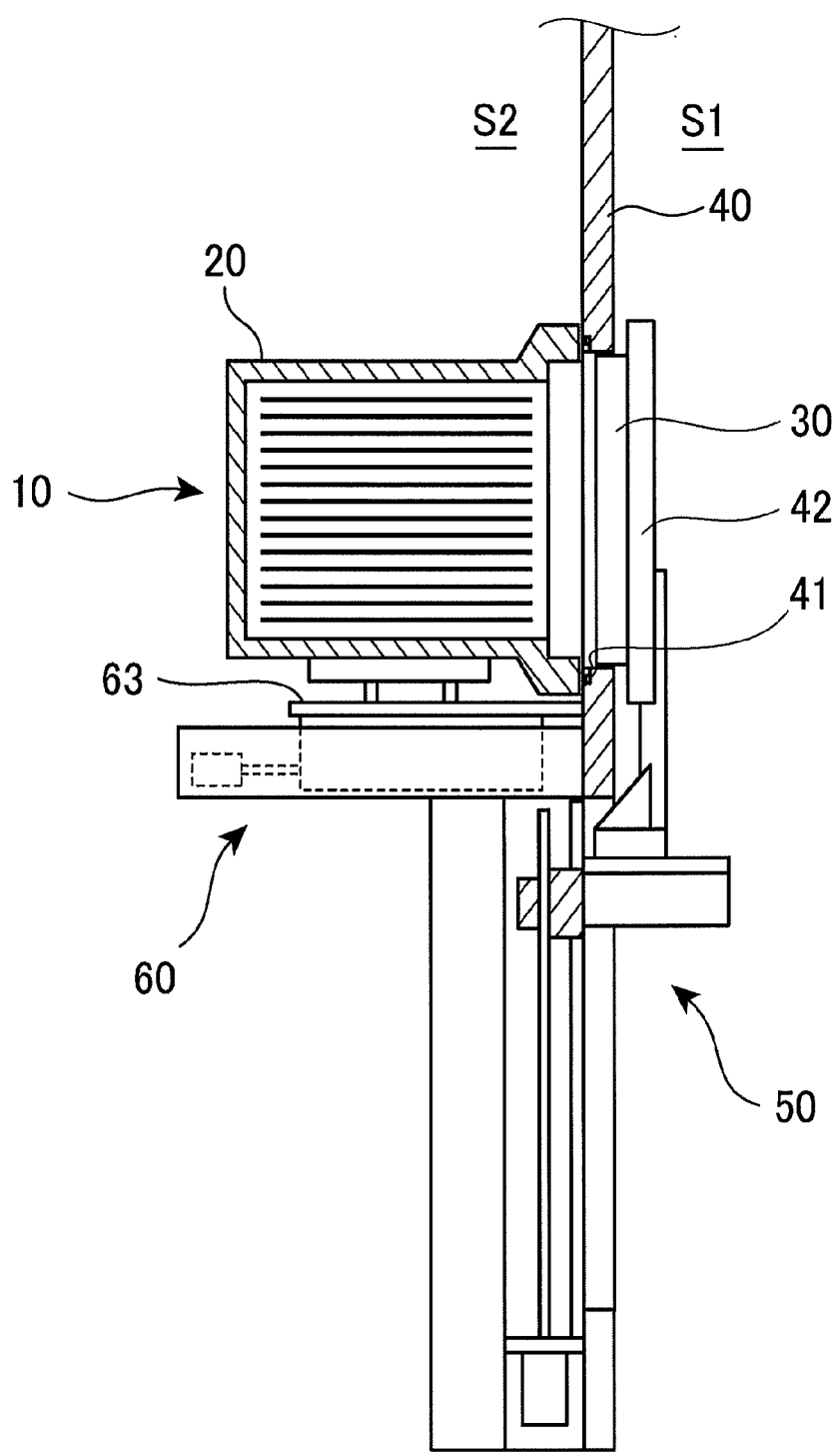
FIG. 5 is an illustrative view showing a state in which the port door not holding the FOUP door is positioned in the withdrawn position.
Figure 6:
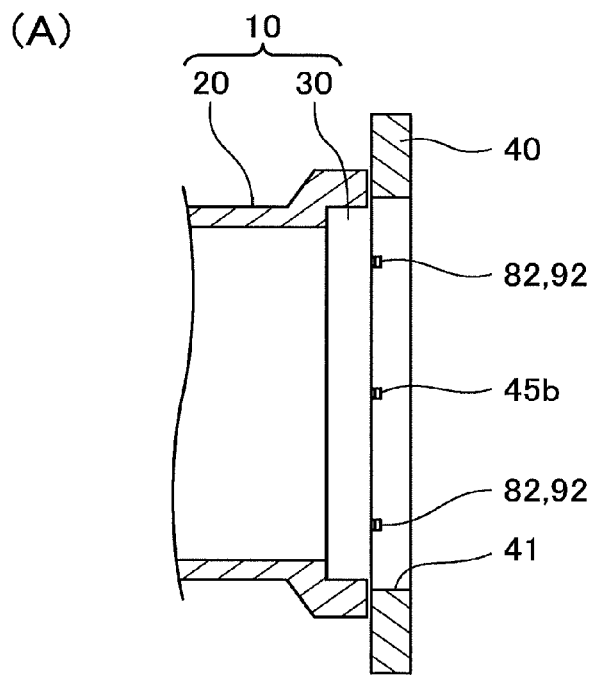
FIG. 6A is a sectional view taken along a A-A line in FIG. 2(A) and showing a state in which the FOUP door is attached to a FOUP main body in a correct fixing position.
FIG. 6B is a sectional view taken along the A-A line in FIG. 2(A) and showing an example of a state in which the FOUP door is attached to the FOUP main body incorrectly.
Figure 6:
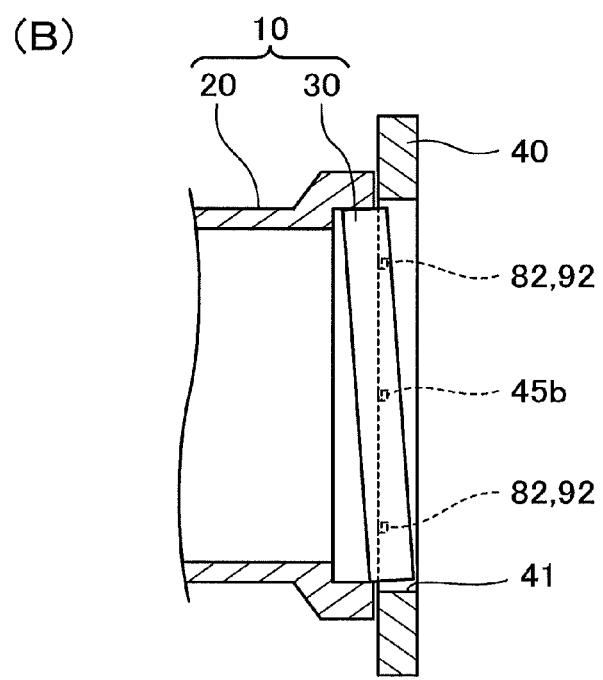

Next, in order to determine whether or not the FOUP door 30 has been fixed correctly in the predetermined fixing position using the FOUP opener M according to this embodiment, the port door 42 caused to perform the hold releasing operation described above is caused to retreat to the withdrawn position in a direction heading away from the FOUP door 30 (port door withdrawal step; see FIG. 5).

The withdrawn position is a position in which the port door 42 does not block the optical path L of the FOUP door detection sensors 80, 90. Accordingly, a distance by which the port door 42 retreats is preferably a minimum distance at which the port door 42 does not interfere with the optical path L of the FOUP door detection sensors 80, 90. Note that the port door retreating distance corresponds to the movement distance of the port door 42 between the closed window position and the withdrawn position.

At this time, the FOUP door 30 is not held on the port door 42, and therefore only the port door 42, and not the FOUP door 30, retreats to the withdrawn position. Accordingly, either a gap (a space) is formed between the FOUP door 30 and the port door 42 such that the FOUP door 30 and the port door 42 do not contact each other, or an end portion of the FOUP door 30 leans against the port door 42.

Next, the FOUP door detection sensors 80, 90 determine whether or not the fixing position of the FOUP door 30 is the correct fixing position, or in other words whether or not at least a part of the FOUP door 30 is jutting out from the opening portion end surface of the FOUP main body 20 (FOUP door detecting step).

More specifically, the determination as to whether or not the FOUP door 30 is in the correct fixing position is made on the basis of whether or not the FOUP door detection light receiving units 82, 92 of the two FOUP door detection sensors 80, 90 receive the light beams emitted by the light emitting units 81, 91. For example, when the light receiving units 82, 92 receive the light beams, the controller 70 determines that the optical path L is not blocked by the FOUP door 30 and therefore that the FOUP door 30 is fixed to the FOUP main body 20 in the correct fixing position. When the light receiving units 82, 92 do not receive the light beams, on the other hand, the controller 70 determines that the FOUP door 30 is attached so as to jut out from the opening portion end surface of the FOUP main body 20 onto the optical path L, thereby preventing reception of the light beams, and determines accordingly that the FOUP door is not in the correct fixing position.

When the FOUP door 30 is fixed to the FOUP main body 20 in the correct fixing position while the FOUP main body 20 is positioned in the FOUP door attachment/detachment position, the FOUP door outer surface 30*a* (see FIG. 4A) is positioned either on a plane that is flush with the port plate outer surface 40*a* or beyond this flush plane toward the FOUP main body and either on a plane that is flush with the port plate outer surface 40*a* or beyond this flush plane toward the exterior space. Hence, the determination can be made as described above.

When it is determined that the FOUP door 30 is not in the correct fixing position, a notification that the FOUP door 30 is fixed incorrectly is issued by generating a notification sound or displaying a message indicating that the FOUP door 30 is fixed incorrectly on a display, not shown in the drawings, of the controller.

Next, the port door moving mechanism 50 is activated to move the port door 42 back to the closed window position (the hold releasing position) such that the opening window of the port plate 40 is closed (port door returning step).

As a result, the wafer transfer space S1 is cut off from the outside again. When it is determined in the previous step (the FOUP door detecting step) that the FOUP door 30 is not in the correct fixing position, the operation of the FOUP opener M is halted upon completion of this step. An operation for attaching the FOUP door 30 correctly to the predetermined position of the FOUP main body 20 is then performed manually by an operator, for example, as appropriate. Once the FOUP door 30 has been attached, the operation of the FOUP opener M is restarted.

When it is determined in the previous step (the FOUP door detecting step) that the FOUP door is in the correct fixing position, on the other hand, a following FOUP unloading step is executed.

In the FOUP unloading step, the cylinder 62 is activated to move the dock plate 63 to the FOUP loading/unloading position (FOUP unloading step; see FIG. 4A).

As a result, the FOUP 10 carried on the dock plate 63 is also moved to the FOUP loading/unloading position. After being moved to the FOUP loading/unloading position, the FOUP 10 is unloaded from the dock unit 60 by the transporting means, not shown in the drawings.

Note that a retry operation may be performed automatically at the end of the port door returning step before halting the operation of the FOUP opener M. The retry operation may be performed repeatedly a required number of times. When the FOUP door 30 is determined to be in the correct fixing position after having the FOUP opener M execute the retry operation, the retry operation is interrupted and the following FOUP unloading step is executed.

The retry operation executed after the port door returning step and before halting the operation of the FOUP opener M is constituted by a series of steps, namely the FOUP door holding step, FOUP door releasing step, door removing step, FOUP door attaching step, FOUP door fixing step, FOUP door hold releasing step, port door withdrawal step, FOUP door detecting step, and port door returning step described above. The door removing step may be eliminated from this series of steps, but in this case, the FOUP door attaching step preferably serves as a FOUP door pushing step of pushing the FOUP door 30 against the FOUP main body 20 using the port door 42.

What is claimed is:

1. An operating method for a front opening unified pod (FOUP) opener in which a port door is attached detachably to a wafer loading/unloading opening window formed in a port plate for separating a wafer transfer space in a semiconductor processing device from an exterior space, a dock unit carrying a FOUP used to transport a semiconductor wafer through said exterior space is provided, said dock unit positions said FOUP in a FOUP door attachment/detachment position in which an outer surface of a FOUP door attached detachably to an opening portion of a FOUP main body of said FOUP contacts an outer surface of said port door attached to said opening window of said port plate, and a FOUP door fixing member for attaching/detaching said FOUP door and a FOUP door holding member for holding said FOUP door when said FOUP door is removed are disposed on said port door, and a wafer detection sensor is disposed in a central position on an upper surface and a lower surface of an inner peripheral portion of the opening window,
    a processed semiconductor wafer processed by said semiconductor processing device being loaded into said FOUP main body positioned in said FOUP door attachment/detachment position, said opening window being closed by said port door and said FOUP door being attached to said opening portion of said FOUP main body, said attached FOUP door being fixed to said FOUP main body, a hold exerted on said FOUP door by said port door being released, and said FOUP being then unloaded from said dock unit,
    said method comprising, between release of said hold on said FOUP door and unloading of said FOUP:
        a port door withdrawal step of causing said port door closing said opening window in said port plate to retreat in a direction heading away from said FOUP door so that said port door moves to a withdrawn position located a predetermined distance away from a FOUP door hold releasing position;
        a FOUP door detecting step of determining with a FOUP door detection sensor whether or not said FOUP door of said FOUP positioned in said FOUP door attachment/detachment position is projecting outwardly from a port door side end surface of said FOUP main body;
        a port door returning step of re-closing said opening window using said port door by moving said withdrawn port door from said withdrawn position back to a position of contact with said FOUP door; and
        said FOUP door detecting step is a step of determining if said FOUP door is tilting and projecting and incorrectly fixed to said FOUP main body by said FOUP door detection sensor after moving said port door to said withdrawn position.

2. The operating method for a FOUP opener according to claim 1, wherein said FOUP door detecting step is a step of determining whether or not said FOUP door fixed to said FOUP main body positioned in said FOUP door attachment/detachment position is projecting to said wafer transfer space side from a plane that is flush with said port plate outer surface on the basis of whether or not a light beam emitted by light emitting means of said sensor can be received by light receiving means.

3. The operating method for a FOUP opener according to claim 2, wherein said port door withdrawal step is a step of releasing a hold exerted by said port door on said FOUP door by activating said FOUP door holding member in a state where said FOUP door is fixed to said opening portion of said FOUP main body positioned in said FOUP door attachment/detachment position, and then causing said port door to retreat to a position in which an optical path of said light beam emitted by said light emitting means is not blocked.

4. The operating method for a FOUP opener according to claim 2, further comprising a halting step that is performed after said FOUP door detecting step, and
    an attaching step that is performed after said halting step, said halting step is a step of halting operation of the FOUP opener, and
    said attaching step is a step of attaching said FOUP door correctly to a predetermined position of said FOUP main body if it is determined that said FOUP door is not in a correct fixing position at said FOUP door detecting step.

5. The operating method for a FOUP opener according to claim 2, wherein said FOUP door detection sensor includes a light emitting unit and a light receiving unit, said light emitting unit emits a detection light beam from said light emitting unit to said light receiving unit vertically.

6. The operating method for a FOUP opener according to claim 5, wherein said light emitting unit is disposed on one of said surfaces between said wafer detection sensor disposed in a central position of the surface and an end position in the surface, and
    said light receiving unit is disposed on the other one of said surfaces between said wafer detection sensor disposed in a central position of the surface and an end position in the surface.

7. The operating method for a FOUP opener according to claim 2, wherein said FOUP door detection sensor includes a light emitting unit and a light receiving unit,
    said light emitting unit emits a detection light beam from said light emitting unit to said light receiving unit horizontally.

8. The operating method for a FOUP opener according to claim 2, wherein said FOUP door detection sensor includes a light emitting unit and a light receiving unit,
    said light emitting unit emits a detection light beam from said light emitting unit to said light receiving unit diagonally.

9. The operating method for a FOUP opener according to claim 1, wherein said FOUP door detecting step is a step of determining tilting and projecting out of said FOUP door fixed to said FOUP main body incorrectly by said FOUP door detection sensor and said wafer detection sensor after moving said port door to said withdrawn position.

10. An operating method for a front opening unified pod (FOUP) opener in which a port door is attached detachably to a wafer loading/unloading opening window formed in a port plate for separating a wafer transfer space in a semiconductor processing device from an exterior space, a dock unit carrying a FOUP used to transport a semiconductor wafer through said exterior space is provided, said dock unit positions said FOUP in a FOUP door attachment/detachment position in which an outer surface of a FOUP door attached detachably to an opening portion of a FOUP main body of said FOUP contacts an outer surface of said port door attached to said opening window of said port plate, and a FOUP door fixing member for attaching/detaching said FOUP door and a FOUP door holding member for holding said FOUP door when said FOUP door is removed are disposed on said port door,
    a processed semiconductor wafer processed by said semiconductor processing device being loaded into said FOUP main body positioned in said FOUP door attachment/detachment position, said opening window being closed by said port door and said FOUP door being attached to said opening portion of said FOUP main body, said attached FOUP door being fixed to said FOUP main body, a hold exerted on said FOUP door by said port door being released, and said FOUP being then unloaded from said dock unit,
    said method comprising, between release of said hold on said FOUP door and unloading of said FOUP:
        a port door withdrawal step of causing said port door closing said opening window in said port plate to retreat in a direction heading away from said FOUP door so that said port door moves to a withdrawn position located a predetermined distance away from a FOUP door hold releasing position;
        a FOUP door detecting step of determining with a sensor whether or not said FOUP door of said FOUP positioned in said FOUP door attachment/detachment position is projecting outwardly from a port door side end surface of said FOUP main body;

a port door returning step of re-closing said opening window using said port door by moving said withdrawn port door from said withdrawn position back to a position of contact with said FOUP door; and said FOUP door detecting step is a step of determining if said FOUP door is tilting and projecting and incorrectly fixed to said FOUP main body by said sensor after moving said port door to said withdrawn position.

11. The operating method for a FOUP opener according to claim 10, wherein said FOUP door detecting step is a step of determining whether or not said FOUP door fixed to said FOUP main body positioned in said FOUP door attachment/detachment position is projecting to said wafer transfer space side from a plane that is flush with said port plate outer surface on the basis of whether or not a light beam emitted by light emitting means of said sensor can be received by light receiving means.

12. The operating method for a FOUP opener according to claim 11, wherein said port door withdrawal step is a step of releasing a hold exerted by said port door on said FOUP door by activating said FOUP door holding member in a state where said FOUP door is fixed to said opening portion of said FOUP main body positioned in said FOUP door attachment/detachment position, and then causing said port door to retreat to a position in which an optical path of said light beam emitted by said light emitting means is not blocked.

13. The operating method for a FOUP opener according to claim 11, further comprising a halting step that is performed after said FOUP door detecting step, and an attaching step that is performed after said halting step, said halting step is a step of halting operation of the FOUP opener, and said attaching step is a step of attaching said FOUP door correctly to a predetermined position of said FOUP main body if it is determined that said FOUP door is not in a correct fixing position at said FOUP door detecting step.

14. The operating method for a FOUP opener according to claim 11, wherein said FOUP door detection sensor includes a light emitting unit and a light receiving unit, said light emitting unit emits a detection light beam from said light emitting unit to said light receiving unit vertically.

15. The operating method for a FOUP opener according to claim 11, wherein said FOUP door detection sensor includes a light emitting unit and a light receiving unit, said light emitting unit emits a detection light beam from said light emitting unit to said light receiving unit horizontally.

16. The operating method for a FOUP opener according to claim 11, wherein said FOUP door detection sensor includes a light emitting unit and a light receiving unit, said light emitting unit emits a detection light beam from said light emitting unit to said light receiving unit diagonally.

* * * * *